(12) United States Patent
Brogle et al.

(10) Patent No.: US 12,080,708 B2
(45) Date of Patent: *Sep. 3, 2024

(54) MONOLITHIC MULTI-I REGION DIODE LIMITERS

(71) Applicant: MACOM Technology Solutions Holdings, Inc., Lowell, MA (US)

(72) Inventors: James Joseph Brogle, Merrimac, MA (US); Joseph Gerard Bukowski, Derry, NH (US); Margaret Mary Barter, Lowell, MA (US); Timothy Edward Boles, Tyngsboro, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/306,342

(22) Filed: Apr. 25, 2023

(65) Prior Publication Data

US 2023/0260992 A1  Aug. 17, 2023

Related U.S. Application Data

(60) Continuation of application No. 17/374,314, filed on Jul. 13, 2021, now Pat. No. 11,705,448, which is a
(Continued)

(51) Int. Cl.
*H01L 27/06* (2006.01)
*H01L 21/225* (2006.01)
(Continued)

(52) U.S. Cl.
CPC ...... *H01L 27/0676* (2013.01); *H01L 21/2253* (2013.01); *H01L 21/2254* (2013.01);
(Continued)

(58) Field of Classification Search
None
See application file for complete search history.

(56) References Cited

U.S. PATENT DOCUMENTS 3,217,212 A  11/1965 Ryder
4,074,303 A  2/1978 Benda et al.
(Continued)

FOREIGN PATENT DOCUMENTS

CN  105049015 A  11/2015
CN  105932023 A * 9/2016 ........... H01L 23/535
(Continued)

OTHER PUBLICATIONS

Boles, Timothy; et al. "Monolithic High Power 300 Watt, S-Band, HMIC PIN Diode Limiter." 2019 IEEE International Conference on Microwaves, Antennas, Communications and Electronic Systems (COMCAS). IEEE, 2019.
(Continued)

*Primary Examiner* — Scott B Geyer
(74) *Attorney, Agent, or Firm* — Perilla Knox & Hildebrandt LLP; Jason M. Perilla

(57) ABSTRACT

A number of diode limiter semiconductor structures are described. The diode limiters can include a hybrid arrangement of diodes with different intrinsic regions, all formed over the same semiconductor substrate. In one example, a diode limiter includes a first diode having a first doped region formed to a first depth into an intrinsic layer of a semiconductor structure, a second diode having a second doped region formed to a second depth into the intrinsic layer of the semiconductor structure, and at least one passive component. The first diode includes a first effective intrinsic region of a first thickness, the second diode includes a second effective intrinsic region of a second thickness. The first thickness is greater than the second thickness. The
(Continued)

passive component is over the intrinsic layer and electrically coupled as part of the diode limiter.

20 Claims, 10 Drawing Sheets

Related U.S. Application Data division of application No. 16/788,853, filed on Feb. 12, 2020, now Pat. No. 11,127,737.

(60) Provisional application No. 62/804,500, filed on Feb. 12, 2019.

(51) Int. Cl.
| | | |
|---|---|---|
| *H01L 21/265* | (2006.01) | |
| *H01L 23/66* | (2006.01) | |
| *H01L 27/08* | (2006.01) | |
| *H01L 29/868* | (2006.01) | |
| *H01L 21/822* | (2006.01) | |
| *H01L 29/66* | (2006.01) | |

(52) U.S. Cl.
CPC ........ *H01L 21/26513* (2013.01); *H01L 23/66* (2013.01); *H01L 27/0814* (2013.01); *H01L 29/868* (2013.01); *H01L 21/822* (2013.01); *H01L 29/6609* (2013.01); *H01L 2223/6627* (2013.01); *H01L 2223/6666* (2013.01); *H01L 2223/6683* (2013.01)

(56) References Cited

U.S. PATENT DOCUMENTS

| | | | |
|---|---|---|---|
| 4,180,422 A | | 12/1979 | Rosvold |
| 4,452,646 A | * | 6/1984 | Zuleeg .............. H01L 29/66212 |
| | | | 257/280 |
| 4,476,481 A | | 10/1984 | Iesaka et al. |
| 4,587,547 A | | 5/1986 | Amemiya et al. |
| 4,672,402 A | | 6/1987 | Yamaoka et al. |
| 4,673,958 A | | 6/1987 | Bayraktaroglu |
| 4,777,490 A | | 10/1988 | Sharma et al. |
| 4,843,358 A | | 6/1989 | Meise et al. |
| 5,047,829 A | | 9/1991 | Seymour et al. |
| 5,107,318 A | | 4/1992 | Makiuchi et al. |
| 5,126,701 A | | 6/1992 | Adlerstein |
| 5,241,195 A | | 8/1993 | Tu et al. |
| 5,401,984 A | | 3/1995 | Byatt et al. |
| 5,438,213 A | * | 8/1995 | Tailliet ................ H01L 27/0248 |
| | | | 257/357 |
| 5,612,564 A | * | 3/1997 | Fujishima ........... H01L 29/7801 |
| | | | 257/341 |
| 5,633,515 A | | 5/1997 | Gantioler et al. |
| 6,552,626 B2 | | 4/2003 | Sharpe et al. |
| 6,821,860 B1 | | 11/2004 | Behammer |
| 7,129,805 B2 | | 10/2006 | Marion et al. |
| 7,671,379 B2 | | 3/2010 | Goerlach |
| 7,755,173 B2 | | 7/2010 | Mondi et al. |
| 11,127,737 B2 | | 9/2021 | Brogle et al. |
| 11,574,906 B2 | | 2/2023 | Brogle et al. |
| 11,705,448 B2 | | 7/2023 | Brogle et al. |
| 2003/0116777 A1 | | 6/2003 | Yu |
| 2004/0135235 A1 | | 7/2004 | Poveda |
| 2004/0235549 A1 | | 11/2004 | Struble et al. |
| 2005/0077577 A1 | | 4/2005 | Manna et al. |
| 2005/0242412 A1 | | 11/2005 | Gabl |
| 2007/0077725 A1 | | 4/2007 | Wilson et al. |
| 2007/0166942 A1 | | 7/2007 | Cogan et al. |
| 2008/0191306 A1 | | 8/2008 | Goerlach |
| 2008/0296587 A1 | | 12/2008 | Yamamoto et al. |
| 2008/0310066 A1 | * | 12/2008 | Bobde ................. H01L 23/552 |
| | | | 361/111 |
| 2009/0230516 A1 | | 9/2009 | Goodrich et al. |
| 2010/0097120 A1 | | 4/2010 | Bizien et al. |
| 2010/0117725 A1 | * | 5/2010 | Mauder ................ H01L 29/861 |
| | | | 257/656 |
| 2010/0164068 A1 | | 7/2010 | Pennock |
| 2010/0208517 A1 | * | 8/2010 | Lo ........................ G11C 11/36 |
| | | | 257/656 |
| 2010/0308429 A1 | * | 12/2010 | Ma ....................... H01L 31/105 |
| | | | 257/458 |
| 2013/0153916 A1 | | 6/2013 | Weyers et al. |
| 2014/0070369 A1 | | 3/2014 | Kitamura |
| 2016/0099306 A1 | | 4/2016 | Cheng |
| 2017/0317075 A1 | * | 11/2017 | Arai .................. H01L 29/66136 |
| 2020/0127023 A1 | | 4/2020 | Geske et al. |
| 2020/0258883 A1 | | 8/2020 | Brogle et al. |
| 2020/0279844 A1 | | 9/2020 | Brogle et al. |
| 2021/0343706 A1 | | 11/2021 | Brogle et al. |
| 2021/0399143 A1 | | 12/2021 | Boles et al. |

FOREIGN PATENT DOCUMENTS

| | | | |
|---|---|---|---|
| CN | 206658190 U | 11/2017 | |
| DE | 4407279 C1 * | 10/1994 | ......... H01L 27/0255 |
| DE | 19726070 A1 | 12/1998 | |
| EP | 1605508 A2 | 12/2005 | |
| EP | 2940782 A1 | 11/2015 | |
| JP | S57128983 A | 8/1982 | |
| WO | 2020117679 A1 | 6/2020 | |
| WO | 2020167961 A1 | 8/2020 | |
| WO | 2020176878 A1 | 9/2020 | |

OTHER PUBLICATIONS

Brogle, James J.; et al. "A 50 watt monolithic surface-mount series-shunt PIN diode switch with integrated thermal sink." 2010 Asia-Pacific Microwave Conference. IEEE, 2010.

Final Office Action for U.S. Appl. No. 17/289,990 dated May 24, 2023.

Final Office Action from U.S. Appl. No. 16/805,154 mailed Jun. 24, 2022.

International Search Report and Written Opinion dated Jun. 8, 2020 for PCT Patent Application No. PCT/US2020/017945.

International Search Report and Written Opinion for PCT/US2019/064018 dated Feb. 27, 2020.

International Search Report and Written Opinion for PCT/US2020/020471 dated May 28, 2020.

Non-Final Office Action for U.S. Appl. No. 16/805,154 dated Feb. 25, 2022.

Non-Final Office Action for U.S. Appl. No. 17/289,990 dated Nov. 9, 2022.

Rao, M. V.; et al. "Characteristics of fully implanted GaAs vertical PIN diodes." Solid-State Electronics 41.1 (1997): 47-50.

Non-Final Office Action for U.S. Appl. No. 17/289,990 mailed Oct. 12, 2024.

Non-Final Office Action for U.S. Appl. No. 18/151,824 mailed May 23, 2024.

* cited by examiner

| | Incident Peak Power for 1dB Limiting @ 9.4Ghz (dBm) | Incident Peak Power for 10dB Limiting @ 9.4Ghz (dBm) | Incident Peak Power for 15dB Limiting @ 9.4Ghz (dBm) | Recovery Time (3 dB) @ 9.4Ghz (dBm) | Maximum Incident Peak Power (Watts) | Maximum CW Input Power (Watts) |
|---|---|---|---|---|---|---|
| Diode # 1 | 7 | 30 | 40 | 10 | 80 | 2 |
| Diode # 2 | 8 | 31 | 41 | 15 | 90 | 3 |
| Diode # 3 | 8 | 31 | 41 | 15 | 90 | 3 |
| Diode # 4 | 10 | 33 | 43 | 25 | 125 | 4 |
| Diode # 5 | 11 | 34 | 44 | 25 | 125 | 4 |
| Diode # 6 | 15 | 38 | 50 | 75 | 200 | 5 |
| Diode # 7 | 20 | 45 | 53 | 100 | 250 | 6 |
| Diode # 8 | 23 | 46 | 59 | 50 | 500 | 7 |
| Diode # 9 | 30 | 52 | 60 | 250 | 1000 | 10 |

MONOLITHIC MULTI-I REGION DIODE LIMITERS

CROSS-REFERENCE TO RELATED APPLICATIONS

This application is a continuation of Ser. No. 17/374,314, filed Jul. 13, 2021, titled "MONOLITHIC MULTI-I REGION DIODE LIMITERS," which is a divisional of U.S. Non-Provisional application Ser. No. 16/788,853, filed Feb. 12, 2020, titled "MONOLITHIC MULTI-I REGION DIODE LIMITERS," which claims the benefit of and to priority to U.S. Provisional Application No. 62/804,500, filed Feb. 12, 2019, titled "MONOLITHIC MULTI-I REGION PIN DIODE LIMITERS," the entire contents both of which applications are hereby incorporated herein by reference.

BACKGROUND

PIN (p-type-intrinsic-n-type) diode devices can be found in limiter circuits, for example, to protect receivers and provide good broadband performance over a wide frequency range. Various types of PIN diodes, including PIN diodes of different "I" region thicknesses, are specifically designed for use in limiter circuits for high signal applications. For example, some PIN diodes are designed for use in passive limiter control circuits to protect sensitive receiver components, such as low noise amplifiers (LNA), detectors, and mixers. The PIN diodes are capable of operating over a wide frequency range from DC to 20 GHz or higher.

Traditionally, PIN diode devices have been fabricated by the growth, deposition, or other placement of layers vertically on a substrate. A PIN diode is a diode with an undoped intrinsic semiconductor region between a P-type semiconductor region and an N-type semiconductor region. The P-type and N-type regions are typically heavily doped because they are used for ohmic contacts. The inclusion of the intrinsic region between the P-type and N-type regions is in contrast to an ordinary PN diode, which does not include an intrinsic region.

The top, P-type region is the anode of the PIN diode, and the bottom, N-type region or substrate is the cathode of the PIN diode. When unbiased, the PIN diode is in a high impedance state and can be represented as a capacitor, the capacitance of which is given by $C = A_{Anode} D_{si} E_o / T$, where: $A_{Anode}$ is the area of the anode, $D_{si}$ is the dielectric constant of the intrinsic silicon, $E_o$ is the permittivity of free space, and T is the distance between the anode and cathode.

If a positive voltage larger than a threshold value is applied to the anode with respect to the cathode, a current will flow through the PIN diode and the impedance will decrease. A PIN diode in a forward biased state can be represented as a resistor whose value decreases to a minimum value as the current through the PIN diode increases. The bias to change the PIN diode from the high impedance (off) state to the low impedance (on) state can be DC or AC. In the case of an AC voltage, the magnitude must be greater than the threshold value and the duration of the positive voltage must be longer than the transit time of carriers across the intrinsic region.

SUMMARY

A number of diode limiter semiconductor structures are described. The structures are embodied as multistage hybrid diode limiters and can include two or more stages. In one example, a diode limiter includes a first diode having a first doped region formed to a first depth into an intrinsic layer of a semiconductor structure, a second diode having a second doped region formed to a second depth into the intrinsic layer of the semiconductor structure, and at least one passive component. The first diode includes a first effective intrinsic region of a first thickness, the second diode includes a second effective intrinsic region of a second thickness. The first thickness is greater than the second thickness. The passive component is electrically coupled as part of the diode limiter.

In one example, a dopant in the first doped region and in the second doped region includes a P-type dopant, and the first diode and the second diode are PIN diodes. In another example, a dopant in the first doped region and in the second doped region includes an N-type dopant, and the first diode and the second diode are NIP diodes.

In other aspects, the diode limiter further includes a dielectric layer over the intrinsic layer of the semiconductor structure. The dielectric layer includes a plurality of openings. The first doped region is positioned under a first opening among the plurality of openings, and the second doped region is positioned under a second opening among the plurality of openings. A first width of the first opening is different than a second width of the second opening.

In other aspects, the first diode includes a first sidewall, and the second diode further includes a second sidewall. The diode limiter includes an insulator between the first sidewall of the first diode and the second sidewall of the second diode. In another case, the first diode includes a first doped sidewall, and the second diode includes a second doped sidewall. The diode limiter includes an insulator between the first doped sidewall of the first diode and the second doped sidewall of the second diode. In other aspects, the first diode includes a first metallic sidewall conductor, and the second diode includes a second metallic sidewall conductor. The diode limiter includes an insulator between the first metallic sidewall of the first diode and the second metallic sidewall of the second diode.

In other aspects, the first diode includes a first metallic sidewall conductor, the second diode further includes a second metallic sidewall conductor, and the diode limiter includes a first backside contact under the first diode, a second backside contact under the second diode, a first topside cathode contact for the first diode, a first topside anode contact for the first diode, a second topside cathode contact for the second diode, and a second topside anode contact for the second diode.

In other aspects, the first diode includes first doped sidewalls and first metallic sidewall conductors, the second diode includes second doped sidewalls and second metallic sidewall conductors, and the diode limiter further includes a first backside contact under the first diode and a second backside contact under the second diode. The first metallic sidewall conductors are electrically coupled to the first backside contact, and the second metallic sidewall conductors are electrically coupled to the second backside contact. The diode limiter includes a first topside cathode contact for the first diode, a first topside anode contact for the first diode, a second topside cathode contact for the second diode, and a second topside anode contact for the second diode.

In additional aspects, the diode limiter includes a third diode. The third diode includes a third doped region formed to a third depth into the intrinsic layer of the semiconductor structure such the third diode comprises a third effective intrinsic region of a third thickness. The second thickness is greater than the third thickness. In one example, the first diode includes sidewalls, the second diode includes sidewalls, and the third diode comprises sidewalls. The diode limiter includes an insulator between a sidewall of the first diode and a first sidewall of the second diode and between a second sidewall of the second diode and a sidewall of the third diode.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figures 1A, 1B:
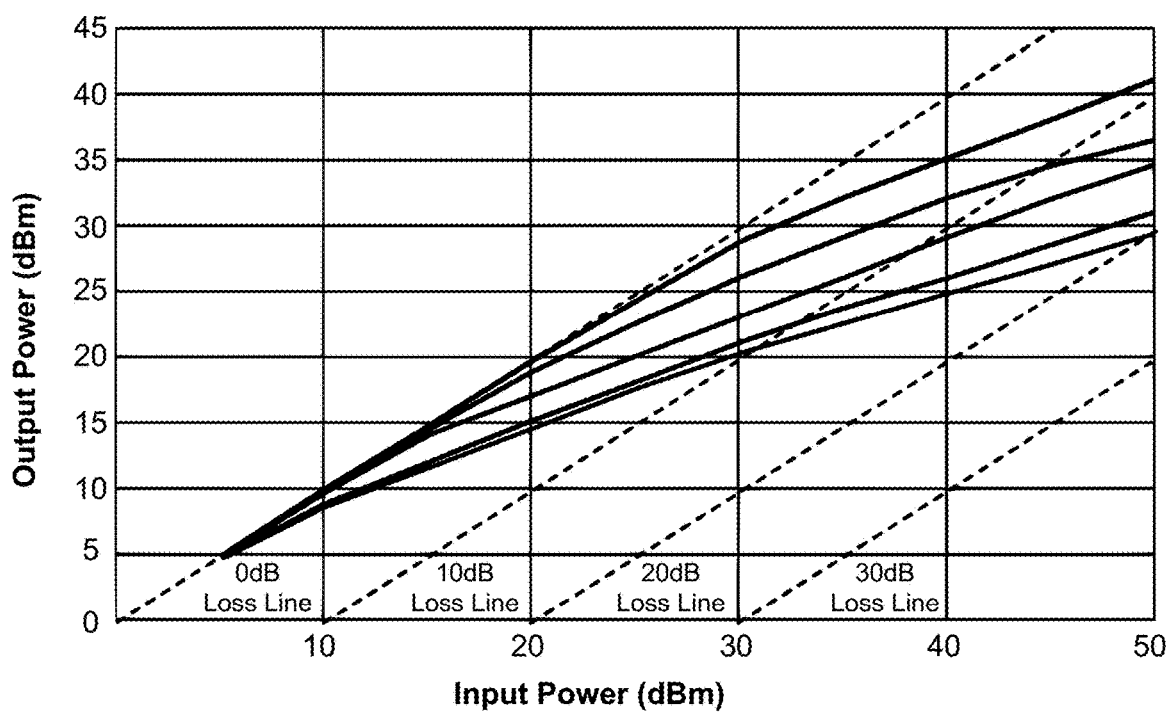
FIG. 1A is a table listing certain characteristics of a number of different PIN diodes that can be used in limiter circuits according various embodiments described herein.
FIG. 1B also illustrates certain characteristics of discrete PIN diodes used in limiter circuits according various embodiments described herein.

As noted above, PIN diode devices can be found in limiter circuits, among others, to protect receivers and provide good broadband performance over a wide frequency range. Various types of PIN diodes, including PIN diodes of different "I" region thicknesses, are specifically designed for use in limiter circuits for high signal applications. FIG. 1A is a table listing certain characteristics of a number of different PIN diodes that can be used in limiter circuits according various embodiments described herein. The example PIN diodes #1-#9 are provided as representative examples in FIG. 1, and the embodiments described herein are not limited to any particular type or class of diode. As shown, the diodes exhibit different characteristics of incident peak power limiting, recovery time, maximum incident peak power, and maximum input power.

FIG. 1B also illustrates certain characteristics of discrete PIN diodes used in limiter circuits according various embodiments described herein. Particularly, FIG. 1B illustrates typical peak power performance (i.e., output vs. input power) for a number of different PIN diodes in a shunt limiter. The different characteristics of the PIN diodes can be based, in part, on the different intrinsic region thicknesses of the PIN diodes. Combinations of the PIN diodes can be electrically coupled and mounted together on a printed circuit board (PCB) or another multi-chip module format in a hybrid multistage limiter configuration as described herein.

Discrete PIN diodes are available in various forms, such as in bare or discrete die form, in plastic packages, and in ceramic packages of various types (e.g., surface mount, pill packages, etc.). PIN diodes in ceramic packages are particularly suitable for waveguide, coaxial, and surface mount applications, while PIN diodes in bare die form are often used for chip and wire high frequency microwave applications.

A simple PIN diode limiter includes a single PIN diode arranged in a shunt configuration with the anode coupled to an input line and the cathode coupled to ground, along with a radio frequency (RF) choke to provide a direct current (DC) return. In this configuration, low level limiting, flat band leakage, and power handling/limiting are determined by the device characteristics of the PIN diode. A received signal passes from the input to the output of the PIN diode. As the signal transitions from the input to the output, a portion of the RF energy is rectified and provides a DC bias to turn on the PIN diode and initiate the limiting function. In a single stage limiter, the low level turn on is controlled based on the thickness of the intrinsic region of the PIN diode. For low flat leakage and rapid initiation of the limiting function, a thin intrinsic region is desired. On the other hand, to be able to handle high incident power levels, provide good isolation, and a low capacitance, a thick intrinsic region thickness is preferred. The need to balance these competing interests generally leads to a compromise solution for a single stage limiter.

According to aspects of the embodiments, a hybrid multistage limiter can be employed for higher incident power levels. In this configuration, two PIN diodes remain in shunt with an input/output transmission line and are separated by a quarter-wavelength (i.e., $\lambda/4$) section of transmission line to provide an RF electrical short between the two diodes. The two PIN diodes can have different intrinsic region thicknesses. A first PIN diode can have a thinner intrinsic region, and the second PIN diode can have a thicker intrinsic region. This configuration allows for both the thin intrinsic region PIN diode and the thick intrinsic region PIN diode to be individually optimized. The thin intrinsic region PIN diode can be optimized for low level turn on and flat leakage, and the thick intrinsic region PIN diode can be optimized for low capacitance, good isolation, and high incident power levels. This configuration is not limited to two stage solutions, as additional stages can be used for higher incident power handling.

However, many of the current design and fabrication techniques for PIN diodes are limited. These techniques cannot be used to form different PIN diode structures, such as PIN diodes with different intrinsic region thicknesses, on a single silicon wafer. Thus, the current design of high-power, multistage limiters generally requires the use of a number of discrete PIN diodes, each formed from a different silicon wafer, to incorporate PIN diodes with different intrinsic region thicknesses into one multistage limiter. These multistage limiters are formed by using a hybrid assembly of individual discrete PIN diodes mounted on a PCB or another multi-chip module format. The number of stages and specific arrangement of PIN diodes in each stage determines the low level RF turn-on, the flat leakage, and the power handling/limiting and frequency response. A monolithic (i.e., integrated silicon) solution would improve the overall reliability, circuit ruggedness, RF performance, circuit size, and overall cost of multistage limiters and other circuits as compared to discrete solutions.

As noted above, the current design and fabrication techniques for planar PIN diodes limit the types of diode structures that can be realized across a silicon wafer. For example, one fabrication technique for PIN diodes limits all the PIN diodes fabricated on a silicon wafer to each have the same "I" (i.e., intrinsic) region thickness. This is a result of several factors. First, PIN diodes are almost exclusively vertical structures, where a metallurgical "I" region is grown or wafer bonded over a highly doped N-type substrate, where he N-type substrate forms the N+ cathode. The P+ anode is then formed in the "I" region either by ion implantation or solid state deposition of a P-type dopant, followed by a heat cycle to activate and diffuse the P-type dopant to a specie depth into the "I" region. The junction depth of the P+ anode after the thermal drive cycle will result in a reduction of the metallurgical "I" region thickness resulting in an effective or electrical "I" region thickness. This approach results in a wafer and subsequent derivative die having an "I" region of only one thickness. In other words, every PIN diode formed through this approach has the same "I" region thickness. For many high frequency circuit functions, however, it is necessary to have PIN diodes with multiple "I" region thicknesses, to achieve a control response over a desired frequency range, for example, and for other operating characteristics.

Another example fabrication technique for PIN diodes is described in U.S. Pat. No. 7,868,428. U.S. Pat. No. 7,868,428 describes the formation of multiple thickness "I" regions on a single wafer using a photolithographic process and lateral gaps between separate P+ and N+ regions. The P+ and N+ regions are ion implanted/diffused into an undoped intrinsic silicon wafer or intrinsic region of a wafer. The difficulty with this lateral surface controlled approach is the fact that relatively high surface leakage, which is in general at least 10 times the leakage levels observed for bulk, vertical devices, produces a very inconsistent turn-on characteristic.

In the context outlined above, a monolithic, vertical, planar semiconductor structure with a number of PIN diodes having different intrinsic regions is described. The PIN diodes have intrinsic regions of different thicknesses as compared to each other. The semiconductor structure includes an N-type silicon substrate, an intrinsic layer formed on the N-type silicon substrate, and a dielectric layer formed on the intrinsic layer. A number of openings are formed in the dielectric layer. Multiple anodes are sequentially formed into the intrinsic layer through the openings formed in the dielectric layer. For example, a first P-type region is formed through a first one the openings to a first depth into the intrinsic layer, and a second P-type region is formed through a second one of the openings to a second depth into the intrinsic layer. Additional P-type regions can be formed to other depths in the intrinsic layer. The approach results in a monolithic semiconductor structure having a number of different "I" region thicknesses among different PIN diodes. The approach can be extended to form a monolithic semiconductor structure having a number of different "I" region thicknesses among different NIP diodes. The monolithic format can provide a number of advantages over conventional techniques where discrete diodes are used, such as smaller size, reduced cost, and better and more controllable frequency response.

The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response. According to aspects of the embodiments, when these diode devices of different intrinsic regions are used in the design of a monolithic multistage limiter, the limiter exhibits improved reliability, ruggedness, RF performance, size, and cost as compared to the current discrete multistage limiter solutions.

In the following paragraphs, various monolithic, vertical, planar semiconductor structures with diode devices having different intrinsic regions are described along with a process for the fabrication of the same. The semiconductor structures with diode devices are then described in the design of various monolithic multistage limiters.

Figure 2A:
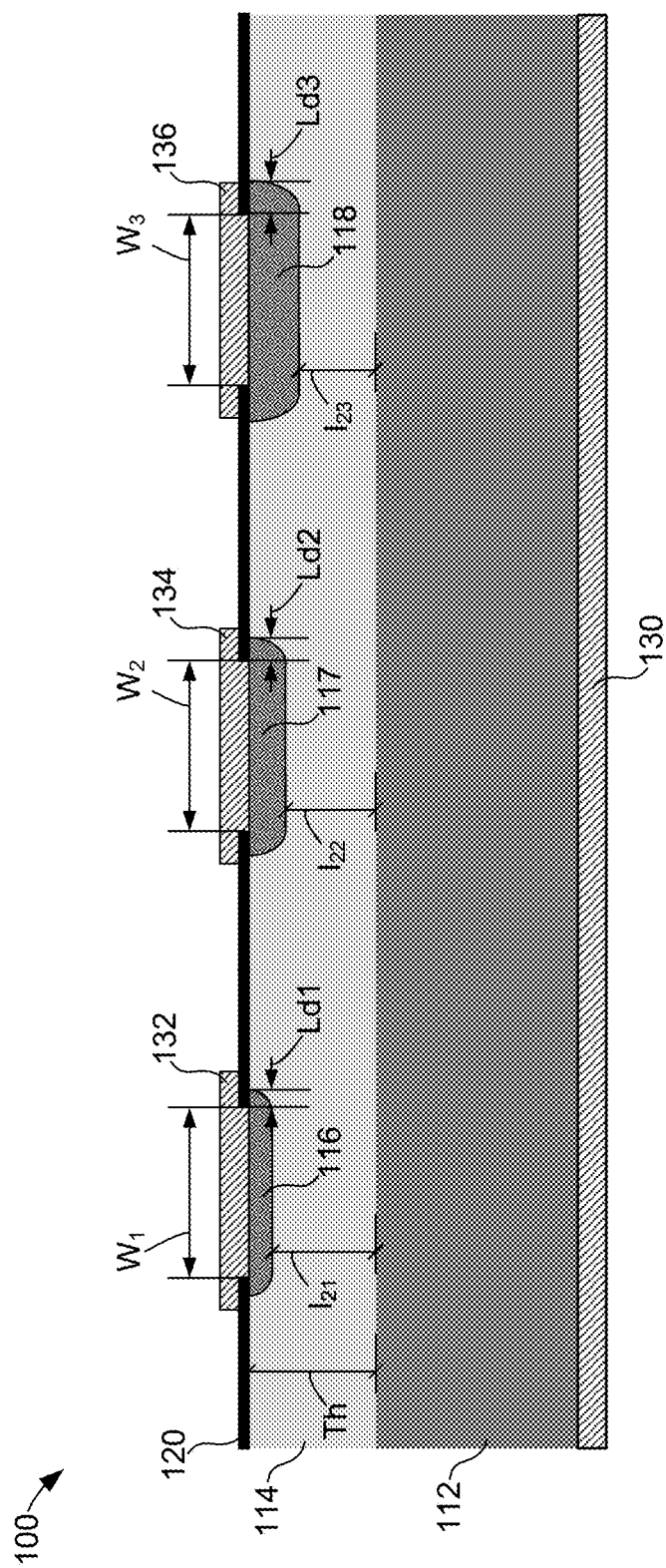
FIG. 2A illustrates an example vertical planar silicon PIN diode structure with multi-thickness intrinsic regions according to various embodiments described herein.

FIG. 2A illustrates an example vertical planar silicon PIN diode structure 100 with multi-thickness intrinsic regions according to various embodiments described herein. The PIN diode structure 100, including three PIN diode devices, is illustrated as a representative example in FIG. 2A. Additional PIN diode devices (i.e., more than three) can be formed as part of the PIN diode structure 100. The shapes, sizes, and relative sizes of the various layers of the PIN diode structure 100 are not necessarily drawn to scale in FIG. 2A. The layers shown in FIG. 2A are not exhaustive, and the PIN diode structure 100 can include other layers and elements not separately illustrated. The PIN diode structure 100 can also be formed as part of a larger integrated circuit device in combination with other diodes, capacitors, inductors, resistors, and layers of metal to electrically interconnect the circuit elements together to form switches, limiters, and other devices as described below. Additionally, a number of NIP diode devices can also be formed to have a structure similar to the structure shown in FIG. 2A, by interchanging the P-type and N-type dopants described below.

The PIN diode structure 100 includes an N-type semiconductor substrate 112, an intrinsic layer 114, a first P-type region 116 formed in the intrinsic layer 114, a second P-type region 117 formed in the intrinsic layer 114, and a third P-type region 118 formed in the intrinsic layer 114. The P-type regions 116-118 are formed through openings of widths $W_1$-$W_3$, respectively, in an insulating layer 120 as described in further detail below. The N-type semiconductor substrate 112 forms a cathode of the PIN diode structure 100. The P-type regions 116-118 form first, second, and third anodes, respectively, of the PIN diode structure 100. The PIN diode structure 100 also includes a cathode contact 130 formed on the N-type semiconductor substrate 112, a first anode contact 132 formed over the first P-type region 116, a second anode contact 134 formed over the second P-type region 117, and a third anode contact 136 formed over the third P-type region 118.

The PIN diode structure 100 shown in FIG. 2A includes three PIN diode devices, but the PIN diode structure 100 can be formed to include any suitable number of PIN diode devices. Electrical contact to the first PIN diode device is available between the cathode contact 130 and the first anode contact 132. Electrical contact to the second PIN diode device is available between the cathode contact 130 and the second anode contact 134. Electrical contact to the third PIN diode device is available between the cathode contact 130 and the third anode contact 136.

To form the PIN diode structure 100 shown in FIG. 2A, the P-type anode regions 116-118 can be formed sequentially, or in turn, in the intrinsic layer 114 as described below with reference to FIG. 2B. The P-type anode region 116 is diffused to the least extent into the intrinsic layer 114, the P-type anode region 117 diffused to a greater extent into the intrinsic layer 114, and the P-type anode region 118 is diffused the greatest extent into the intrinsic layer 114. Thus, the effective intrinsic region $I_{21}$ under the P-type anode region 116 is larger than the effective intrinsic region $I_{22}$ under the P-type anode region 117, and the effective intrinsic region $I_{22}$ is larger than the effective intrinsic region $I_{23}$ under the P-type anode region 118. In one example, the effective intrinsic region $I_{21}$ can be between about 20-23 μm, the effective intrinsic region $I_{22}$ can be about 12 μm, and the effective intrinsic region $I_{23}$ can be about 5 μm, although other ranges are within the scope of the embodiments.

The extent of the lateral diffusions, Ld1, Ld2, and Ld3 of the P-type regions 116-118 under the insulating layer 120 also vary, with the lateral diffusion Ld1 being the smallest and the lateral diffusion Ld3 being the largest. In some cases, to control the capacitance and the high-frequency characteristics of each individual PIN diode, the widths $W_1$-$W_3$ of the openings formed in the insulating layer 120 can vary as compared to each other. For example, $W_3$ can be smaller than $W_2$, and $W_2$ can be smaller than $W_1$.

Figure 2B:
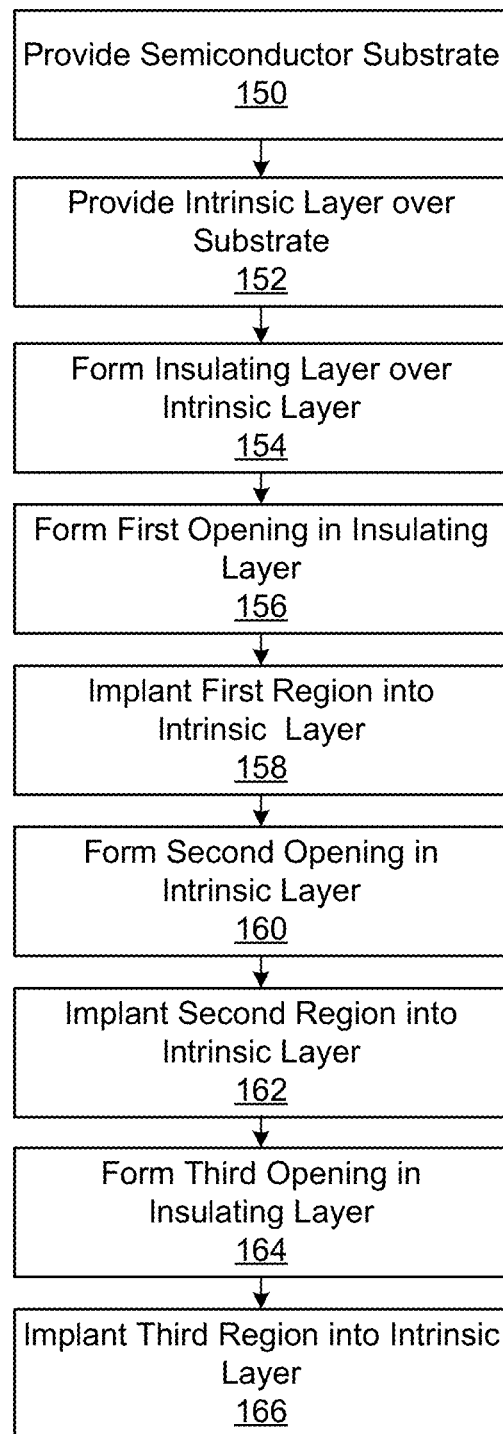
FIG. 2B illustrates an example method of forming the PIN diode structure shown in FIG. 2A according to various embodiments described herein.

FIG. 2B illustrates an example method of forming the PIN diode structure 100 shown in FIG. 2A. Alternatively, a NIP diode structure can also be formed using the method, by interchanging the P-type and N-type dopants, as described below. Although the method diagram illustrates a specific order in FIG. 2B, the order or the steps can differ from that which is depicted. For example, an order of two or more steps can be scrambled relative to the order shown in some cases. Also, two or more steps shown in succession can be performed, at least in part, at the same time. In some cases, one or more of the steps can be skipped or omitted. In other cases, additional steps not shown in FIG. 2B can be relied upon, such as steps among or after the steps shown in FIG. 2B.

At step 150, the process includes providing or forming the N-type semiconductor substrate 112. The semiconductor substrate 112 can be formed by melting and mixing silicon with Arsenic, among other suitable dopants, to a concentration of about $2 \times 10^{19}$ Arsenic atoms/cm$^3$ and then solidifying the mixture, although the substrate 112 can be formed by other methods to other charge carrier concentrations. Additionally or alternatively, step 150 can include providing or sourcing the semiconductor substrate 112, such as when the semiconductor substrate 112 is sourced or purchased from a manufacturer. In another example, a NIP diode structure can be formed using the process shown in FIG. 2B. In that case, the process would include forming a P-type semiconductor substrate at step 150 using Boron, for example, or another P-type dopant rather than Arsenic.

At step 152, the process includes providing the intrinsic layer 114 over the semiconductor substrate 112. The intrinsic layer 114 can be provided or formed on the semiconductor substrate 112 using deposition, wafer bonding, or another suitable technique. The intrinsic layer 14 can have the thickness "Th" of between about 7-100 μm as shown in FIG. 2A, in some cases, although the intrinsic layer 14 can be thicker (e.g., up to about 400 μm) in other cases.

At step 154, the process includes forming the insulating layer 120 over the intrinsic layer 114. The insulating layer 120 can be formed over the intrinsic layer 114 by wet or dry oxidation in a furnace or reactor, local oxidation over the intrinsic layer 114, or other suitable process step(s). The insulating layer 120 can be formed as a passivating dielectric layer of silicon dioxide, among other suitable dielectric insulators, on the upper surface of the intrinsic layer 14. The insulating layer 120 can be formed to a thickness of between about 2000 Å and about 5000 Å, although other suitable thicknesses can be relied upon.

At step 156, the process includes forming a first opening in the insulating layer 120. Referring back to FIG. 2B, the opening of width $W_3$ can be formed at step 156. The opening of width $W_3$ can be formed in the insulating layer 120 by etching a positive photoresist mask using wet chemistry, the application of plasma, or using another suitable technique. No other openings are formed at step 156.

At step 158, the process includes implanting the P-type region 118 into the top of the intrinsic layer 114. The P-type region 118 can be formed by ion implantation or solid source deposition of a high concentration of P-type dopant through the opening formed in the insulating layer 120 at step 156. The P-type region 118 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 118 is formed, a junction is created between the P-type region 118 and the intrinsic layer 114.

Step 158 can also include thermally driving and diffusing the doping element for the P-type region 118 into the intrinsic layer 114. A rapid, high temperature, thermal processing or annealing process step can be used for thermal driving. The depth of the P-type region 118 and the size of the effective intrinsic region $I_{23}$ can be set by the high temperature thermal drive. In some cases, the thermal driving at step 158 is not relied upon, alone, to diffuse or drive the P-type region 118 to the full extent illustrated in FIG. 2A. In some cases, the thermal driving at steps 162 and 166 can also contribute to the diffusion of the P-type region 118 into the intrinsic layer 114, at least in part, as described below.

Alternatively, to form a NIP diode structure, step 158 can include implanting an N-type region into the top of the intrinsic layer 114. The N-type region can be formed by doping the intrinsic layer 114 with Arsenic, for example, or another suitable N-type dopant, to a suitable concentration. Step 158 can also include thermally driving and diffusing the N-type dopant into the intrinsic layer 114.

At step 160, the process includes forming a second opening in the insulating layer 120. Referring back to FIG. 2B, the opening of width $W_2$ can be formed at step 160. The opening of width $W_2$ can be formed in the insulating layer 120 by etching a positive photoresist mask using wet chemistry, the application of plasma, or using another suitable technique. No other openings are formed at step 160.

In some cases, the width $W_2$ can be the same as the width $W_1$. However, one consideration for the PIN diode structure 100 relates to the extent of lateral diffusion, Ld1, Ld2, and Ld3, that results during the high temperature thermal drives at steps 158, 162, and 166. As the junction depths of the P-type regions 116-118 increase, the lateral diffusions Ld1, Ld2, and Ld3 and the overall size of the resulting anodes also increase. In order to control the capacitance and the high-frequency characteristics of each individual PIN diode, the physical dimensions of the openings formed at steps 156, 160, and 164 can vary as compared to each other, to control the amount of the lateral diffusion. For example, $W_3$ can be formed smaller than $W_2$, and $W_2$ can be formed smaller than $W_1$.

At step 162, the process includes implanting the P-type region 117 into the top of the intrinsic layer 114. The P-type region 117 can be formed by ion implantation or solid source deposition of a high concentration of P-type dopant through the opening formed in the insulating layer 120 at step 160. The P-type region 117 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 117 is formed, a junction is created between the P-type region 117 and the intrinsic layer 114.

Step 162 can also include thermally driving and diffusing the doping element for the P-type region 117 into the intrinsic layer 114. A rapid thermal processing or annealing process step can be used for thermal driving. The depth of the P-type region 117 and the effective intrinsic region $I_{22}$ can be set by the high temperature thermal drive. In some cases, the thermal driving at step 162 is not relied upon, alone, to diffuse or drive the P-type region 117 to the extent illustrated in FIG. 2A. In some cases, the thermal driving at step 166 can also contribute to the diffusion of the P-type region 117 into the intrinsic layer 114, at least in part, as described below.

Ideally, the thermal driving of the P-type region 117 at step 162 would not impact or change the extent of the diffusion of the P-type region 118 into the intrinsic layer 114. However, if this thermal restriction cannot be met, then the thermal budget for the thermal drive at step 158 must incorporate or account for the thermal drive at step 162. In other words, the thermal driving at step 162 can also contribute to the diffusion of the P-type region 118 further into the intrinsic layer 114 in some cases, and that diffusion can be accounted for when setting the thermal budget for the thermal drive at step 158.

Alternatively, to form a NIP diode structure, step 162 can include implanting an N-type region into the top of the intrinsic layer 114. The N-type region can be formed by doping the intrinsic layer 114 with Arsenic, for example, to a suitable concentration, although other N-type dopants can be used. Step 162 can also include thermally driving and diffusing the N-type dopant into the intrinsic layer 114.

At step 164, the process includes forming a third opening in the insulating layer 120. Referring back to FIG. 2B, the opening of width $W_3$ can be formed at step 164. The opening of width $W_3$ can be formed in the insulating layer 120 by etching a positive photoresist mask using wet chemistry, the application of plasma, or using another suitable technique. No other openings are formed at step 164.

At step 166, the process includes implanting the P-type region 116 into the top of the intrinsic layer 114. The P-type region 116 can be formed by ion implantation or solid source deposition of a high concentration of P-type dopant through the opening formed in the insulating layer 120 at step 164. The P-type region 116 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 116 is formed, a junction is created between the P-type region 116 and the intrinsic layer 114.

Step 166 can also include thermally driving and diffusing the doping element for the P-type region 116 into the intrinsic layer 114. A rapid thermal processing or annealing process step can be used for thermal driving. The depth of the P-type region 116 and the effective intrinsic region $I_{21}$ can be set by the high temperature thermal drive. In some cases, the thermal driving at step 166 can also contribute to the diffusion of the P-type regions 117 and 118 into the intrinsic layer 114, at least in part. Ideally, the thermal driving of the P-type region 116 at step 166 would not impact or change the extent of the diffusion of the P-type regions 117 and 118 into the intrinsic layer 114. However, if this thermal restriction cannot be met, then the thermal budgets for the thermal drive at steps 158 and 162 must incorporate or account for the thermal drive at step 166.

Alternatively, to form a NIP diode structure, step 166 can include implanting an N-type region into the top of the intrinsic layer 114. The N-type region can be formed by doping the intrinsic layer 114 with Arsenic, for example, to a suitable concentration, although other N-type dopants can be used. Step 166 can also include thermally driving and diffusing the N-type dopant into the intrinsic layer 114.

The process shown in FIG. 2B can also include process steps to form more windows and implant additional anodes in the PIN diode structure 10. Additional process steps, including backside processing steps, can also be relied upon to form the cathode contact 130 and the anode contacts 132, 134, and 136. Other steps can be relied upon to form components on the PIN diode structure 100, as part of a larger integrated circuit device including diodes, capacitors, inductors, resistors, and layers of metal to electrically interconnect the components together to form switches, limiters, and other devices. Particularly, additional steps can be relied upon to form capacitors, inductors, resistors, and layers of metal to electrically interconnect the components together to form the limiters described below with reference to FIGS. 7-9.

FIGS. 2A and 2B encompass monolithic, vertical, planar semiconductor structures including a number of diodes having different intrinsic regions. The diodes have intrinsic regions of different thicknesses as compared to each other. The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response.

The concepts shown in FIGS. 2A and 2B can be extended to other types and arrangements of diode devices. For example, the cathodes of the diodes are electrically connected together in FIG. 2A, although the diodes (and the cathodes of the diodes) can be separated from each other in other example embodiments described below. Additionally, topside contacts can be formed for both the anodes and the cathodes of the diodes, and the backside contacts can be isolated for each diode, or even omitted in some cases, as described below. The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response.

According to aspects of the embodiments described below, when these diode devices of different intrinsic regions are used in the design of a monolithic multistage limiter, the limiter exhibits improved reliability, ruggedness, RF performance, size, and cost as compared to the current discrete multistage limiter solutions.

Figure 3:
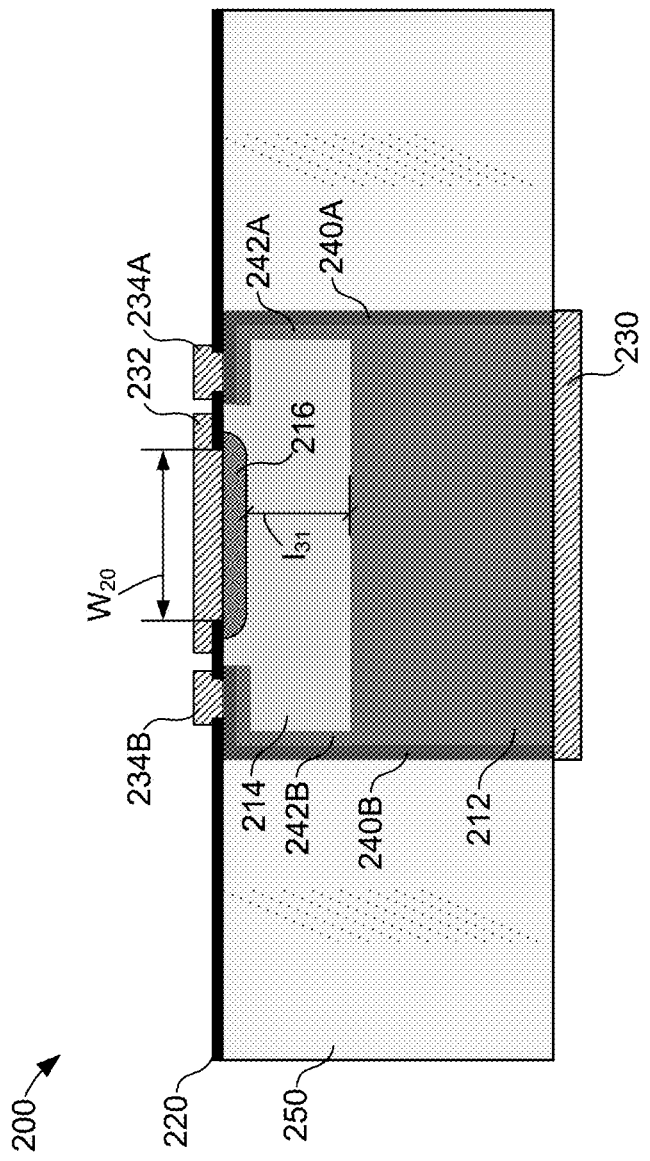
FIG. 3 illustrates an example HMIC silicon PIN diode structure according to various embodiments described herein.

Turning to other embodiments, FIG. 3 illustrates an example HMIC silicon PIN diode structure 200 according to various embodiments described herein. As compared to the diode structure 100 shown in FIG. 2A, the diode structure 200 includes a highly insulative material, such as glass, to form a type of heterolithic microwave integrated circuit (HMIC). The PIN diode structure 200 is illustrated as a representative example in FIG. 3. The shapes and sizes of the layers of the PIN diode structure 200 are not necessarily drawn to scale. The layers shown in FIG. 3 are not exhaustive, and the PIN diode structure 200 can include other layers and elements not separately illustrated. Additionally, the PIN diode structure 200 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 3, by interchanging the P-type and N-type dopants.

The PIN diode structure 200 includes an N-type semiconductor substrate 212, an intrinsic layer 214, and a P-type region 216 formed in the intrinsic layer 214. These layers can be similar in form and size as compared to the corresponding layers in the structure 100, as shown in FIGS. 1 and 2A. The N-type semiconductor substrate 212 forms a cathode and the P-type region 216 forms an anode of the PIN diode structure 200. The P-type region 216 is formed through the opening of width $W_{20}$ in the insulating layer 220. The P-type region 216 can be formed to a depth of between about 2-5 μm in the intrinsic layer 214. With a 100 μm thick intrinsic layer 214, for example, the size of the effective intrinsic region $I_{31}$ can range between about 8-95 μm.

The PIN diode structure 200 includes a topside anode contact 232 formed over the P-type region 216. The PIN diode structure 200 also includes a backside cathode contact 230 and topside cathode contacts 234A and 234B. Metallic sidewall conductors 240A and 240B extend from and electrically connect the backside cathode contact 230 to the topside cathode contacts 234A and 234B, and N+-type doped sidewalls 242A and 242B insulate the metallic sidewall conductors 240A and 240B from the intrinsic layer 214.

As shown in FIG. 3, the N+-type doped sidewalls 242A and 242B and the metallic sidewall conductors 240A and 240B are formed along sidewalls of the intrinsic layer 214 and the substrate 212. The sidewalls of the intrinsic layer 214 and the substrate 212 are exposed through vertical etching of the intrinsic layer 214 and the substrate 212, which forms the intrinsic layer 214 and the substrate 212 into a type of pedestal as shown. The etching process step can be performed, in one example, after the P-type region 216 is formed but before the topside anode contact 232 and cathode contacts 234A and 234B are formed. Either a wet chemical etching or a dry etching technique can be relied upon to expose the sidewalls, as deep cavities can be obtained with either technique.

With a substrate 212 of sufficient thickness, the etching process can etch down through the intrinsic layer 214 and into the substrate 212 to a total depth of about 150-160 μm from a topside of the PIN diode structure 200. If wet chemical etching is relied upon, the sidewalls of the intrinsic layer 214 and the substrate 212 can extend down at an angle (e.g., at about 54.7 degrees) from the top surface of the PIN diode structure 200. If dry etching is relied upon, the sidewalls of the intrinsic layer 214 and the substrate 212 can extend substantially straight down (e.g., at an angle of about 90 degrees down from the top surface of the PIN diode structure 200).

The N+-type doped sidewalls 242A and 242B and the metallic sidewall conductors 240A and 240B can be formed after the etching. The N+-type doped sidewalls 242A and 242B can be formed by diffusing phosphorus, for example, or another N+-type dopant, into the exposed sidewalls of the intrinsic layer 214 and the substrate 212. The metallic sidewall conductors 240A and 240B can then be formed by depositing metal, such as cobalt silicide ($CoSi_2$), over the N+-type doped sidewalls 242A and 242B.

The insulator 250 can then be formed around the metallic sidewall conductors 240A and 240B and, if multiple diodes are formed, between the diodes. The application of the insulator 250 can start with a blanket deposition of about 1500 Å of silicon nitride, for example, by low pressure chemical vapor deposition (LPCVD), followed by the deposit of about 4000 Å of low temperature oxide (LTO). Those layers (although not shown in FIG. 3) can encapsulate and protect the diodes during the application of the insulator 250. The insulator 250 can then be fused into the area around the metallic sidewall conductors 240A and 240B, forming a conformal layer. The insulator 250 can be formed to a thickness of at least 50 μm higher than the depth of the vertical etch, to allow for a step of glass planarization.

The insulator 250 can be a borosilicate glass, for example, which exhibits a low dielectric constant, a low loss tangent, and a thermal coefficient of expansion similar to silicon for ruggedness over a broad temperature range, although other types of insulators can be relied upon. Although a single diode device is illustrated in FIG. 3, the insulator 250 can be relied upon to separate a number of different, side-by-side diode devices as described below with reference to FIGS. 5-7. The insulator 250 also permits a variety of different electrical connections among the diodes, by isolating them from each other.

After the insulator 250 is fused, a number of backside processing steps can be performed. A backside of the substrate 212 can be ground down until the insulator 250 is exposed. The backside cathode contact 230 can then be formed to extend over the metallic sidewall conductors 240A and 240B and the bottom side of the substrate 212. When formed, the backside cathode contact 230 is electrically connected to the metallic sidewall conductors 240A and 240B. The backside cathode contact 230 is then electrically connected to the topside cathode contacts 234A and 234B via the metallic sidewall conductors 240A and 240B. Thus, with the inclusion of the metallic sidewall conductors 240A and 240B and the topside cathode contacts 234A and 234B, both anode and cathode contacts are available on top of the PIN diode structure 200. As such, the PIN diode structure 200 is designed to facilitate shunt connections among diodes.

Figure 4:
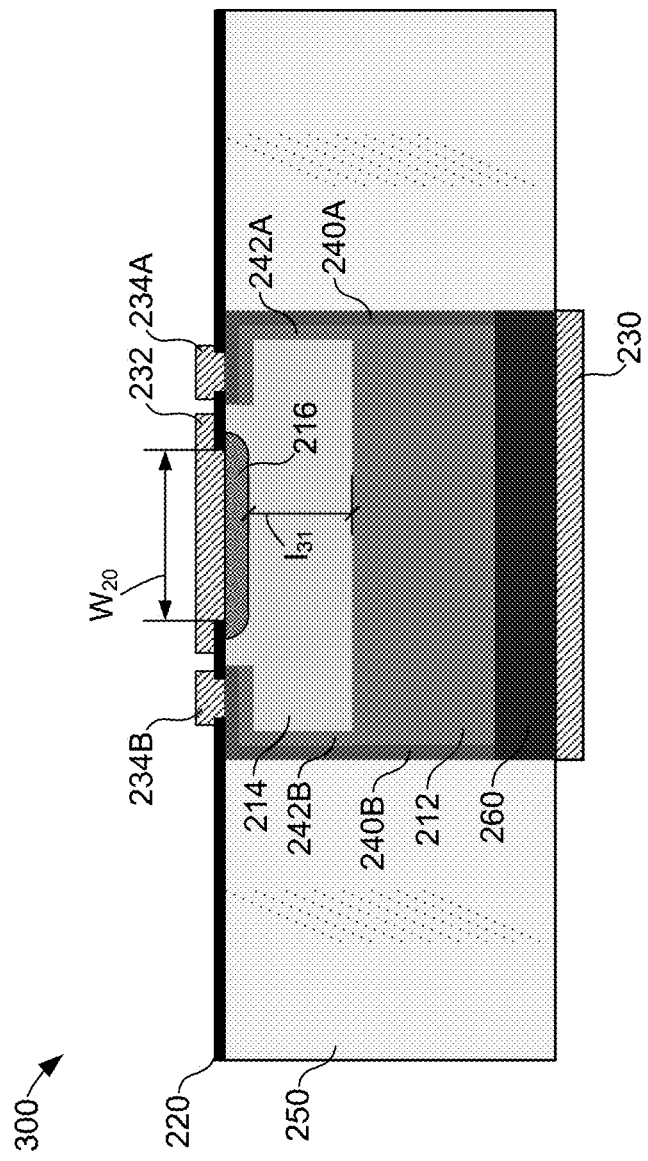
FIG. 4 illustrates another example HMIC silicon PIN diode structure according to various embodiments described herein.

In another embodiment, FIG. 4 illustrates an example HMIC silicon PIN diode structure 300. As compared to the PIN diode structure 300 shown in FIG. 3, the PIN diode structure 300 also includes an insulating material layer 260, such as boron nitride or a thermal epoxy, among other suitable insulators, between the N-type semiconductor substrate 212 and the backside cathode contact 230. The semiconductor substrate 212 can be etched from the backside of the semiconductor substrate 212 to a depth of about 50 μm, opening an area or void for the insulating material layer 260. Thus, the diode structure 300 is particularly suitable for series connections among diodes. The cathode contact 230 may be optionally included in the embodiment shown in FIG. 4 for the purpose of mechanical die attachment. In some cases, the cathode contact 230 can be omitted.

Both the PIN diode structure 200 shown in FIG. 3 and the PIN structure 300 shown in FIG. 4 can be extended to NIP structures. Additionally, both the PIN diode structure 200 and the PIN structure 300 can be extended to include a number of diodes with different "I" region thicknesses, in a monolithic format, as described below.

Figure 5A:
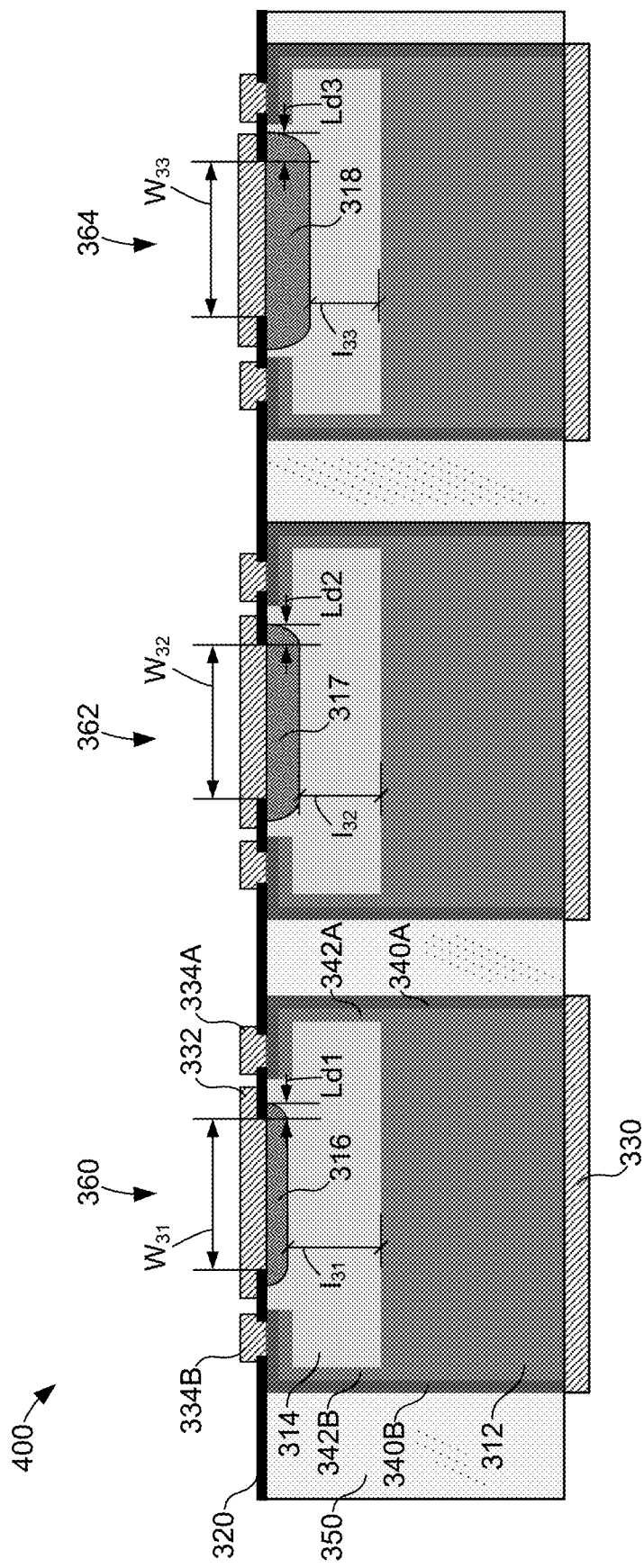
FIG. 5A illustrates another example HMIC silicon PIN diode structure with multi-thickness intrinsic regions according to various embodiments described herein.

FIG. 5A illustrates an example HMIC silicon PIN diode structure 400 according to various embodiments described herein. The PIN diode structure 400 is illustrated as a representative example in FIG. 5A. The shapes and sizes of the layers of the PIN diode structure 400 are not necessarily drawn to scale. The layers shown in FIG. 5A are not exhaustive, and the PIN diode structure 400 can include other layers and elements not separately illustrated. Additionally, the PIN diode structure 400 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 5A, by interchanging the P-type and N-type dopants.

The PIN diode structure 400 includes PIN diode devices 360, 362, and 364, formed as first, second, and third pedestals. The PIN diode device 360 includes an N-type semiconductor substrate 312 and an intrinsic layer 314, which are formed into a first pedestal by etching as described below. These layers are similar in vertical thickness as compared to the corresponding layers in the structure 200 shown in FIG. 3. A P-type region 316 is formed in the intrinsic layer 314. The N-type semiconductor substrate 312 forms a cathode and the P-type region 316 forms an anode of the PIN diode device 360. The P-type region 316 is formed through the opening of width $W_{31}$ in the insulating layer 320. The PIN diode devices 362 and 364 also include similar N-type semiconductor substrate and an intrinsic layers as shown, which are formed into first and second pedestals, respectively, by etching.

The PIN diode devices 362 and 364 are similar in form and size as compared to the PIN diode device 360. However, the P-type region 317 is diffused deeper than the P-type region 316, and the P-type region 318 is diffused deeper than the P-type region 317. To obtain that form, a method of manufacturing the PIN diode structure 400 can follow the process steps illustrated in FIG. 2B and described above. Particularly, the P-type regions 316-318 can be formed sequentially, or in turn, in the intrinsic layer 314 according to the process steps shown in FIG. 2B. In that way, the P-type region 316 is diffused to the least extent into the intrinsic layer 314, the P-type region 317 diffused to a greater extent into the intrinsic layer 314, and the P-type region 318 is diffused the greatest extent into the intrinsic layer 314. Thus, the effective intrinsic region $I_{31}$ under the P-type region 316 is larger than the effective intrinsic region $I_{32}$ under the P-type region 317, and the effective intrinsic region $I_{32}$ is larger than the effective intrinsic region $I_{33}$ under the P-type region 318. In one example, the effective intrinsic region $I_{31}$ can be between about 20-23 μm, the effective intrinsic region $I_{32}$ can be about 12 μm, and the effective intrinsic region $I_{33}$ can be about 5 μm, although other ranges are within the scope of the embodiments.

The extent of the lateral diffusions, Ld1, Ld2, and Ld3 of the P-type regions 316-318 can also vary as described above, with the lateral diffusion Ld1 being the smallest and the lateral diffusion Ld3 being the largest. In some cases, to control the capacitance and the high-frequency characteristics of the PIN diode devices 360, 362, and 364, individually, the widths $W_{31}$-$W_{33}$ of the openings formed in the insulating layer 320 can vary as compared to each other. For example, $W_{33}$ can be smaller than $W_{32}$, and $W_{32}$ can be smaller than $W_{31}$.

The PIN diode device 360 includes a topside anode contact 332 formed over the P-type region 316. The PIN diode device 360 also includes a backside cathode contact 330 and topside cathode contacts 334A and 334B. Metallic sidewall conductors 340A and 340B extend from and electrically connect the backside cathode contact 330 to the topside cathode contacts 334A and 334B, and N+-type doped sidewalls 342A and 342B insulate the metallic sidewall conductors 340A and 340B from the intrinsic layer 314. These features can be similar in form and size as compared to the corresponding features in the structure 200 shown in FIG. 3. The PIN diode devices 362 and 364 can include similar features as shown in FIG. 5A.

The N+-type doped sidewalls 342A and 342B and the metallic sidewall conductors 340A and 340B are formed along sidewalls of the intrinsic layer 314 and the substrate 312 of the PIN diode device 360. The sidewalls of the intrinsic layer 314 and the substrate 312 are exposed through vertical etching of the intrinsic layer 314 and the substrate 312 in a manner similar to that described above with reference to FIG. 3, but among all of the PIN diode devices 360, 362, and 364. The insulator 350 can then be formed around the metallic sidewall conductors 340A and 340B and the corresponding sidewall features of the PIN diode devices 362 and 364.

The application of the insulator 350 can start with a blanket deposition of silicon nitride by LPCVD, for example, followed by a deposit of LTO. Those layers (although not shown in FIG. 5A) can encapsulate and protect the PIN diode devices 360, 362, and 364 during the application of the insulator 350. The insulator 350 can then be fused into the etched areas around the PIN diode devices 360, 362, and 364, forming a conformal layer. The insulator 350 can be formed to a thickness of at least 50 μm higher than the depth of the vertical etch, to allow for a step of glass planarization. The insulator 350 can be a borosilicate glass, for example, which exhibits a low dielectric constant, a low loss tangent, and a thermal coefficient of expansion similar to silicon for ruggedness over a broad temperature range, although other types of insulators can be relied upon.

After the insulator 350 is fused, a number of backside processing steps can be performed. A backside of the substrate 312 can be ground down until the insulator 350 is exposed. The backside cathode contact 330 can then be formed to extend over the metallic sidewall conductors 340A and 340B and the bottom side of the substrate 312. When formed, the backside cathode contact 330 is electrically connected to the metallic sidewall conductors 340A and 340B. The backside cathode contact 330 is then electrically connected to the topside cathode contacts 334A and 334B via the metallic sidewall conductors 340A and 340B. The PIN diode structure 400 is designed to facilitate shunt connections among the PIN diode devices 360, 362, and 364.

Figure 5B:
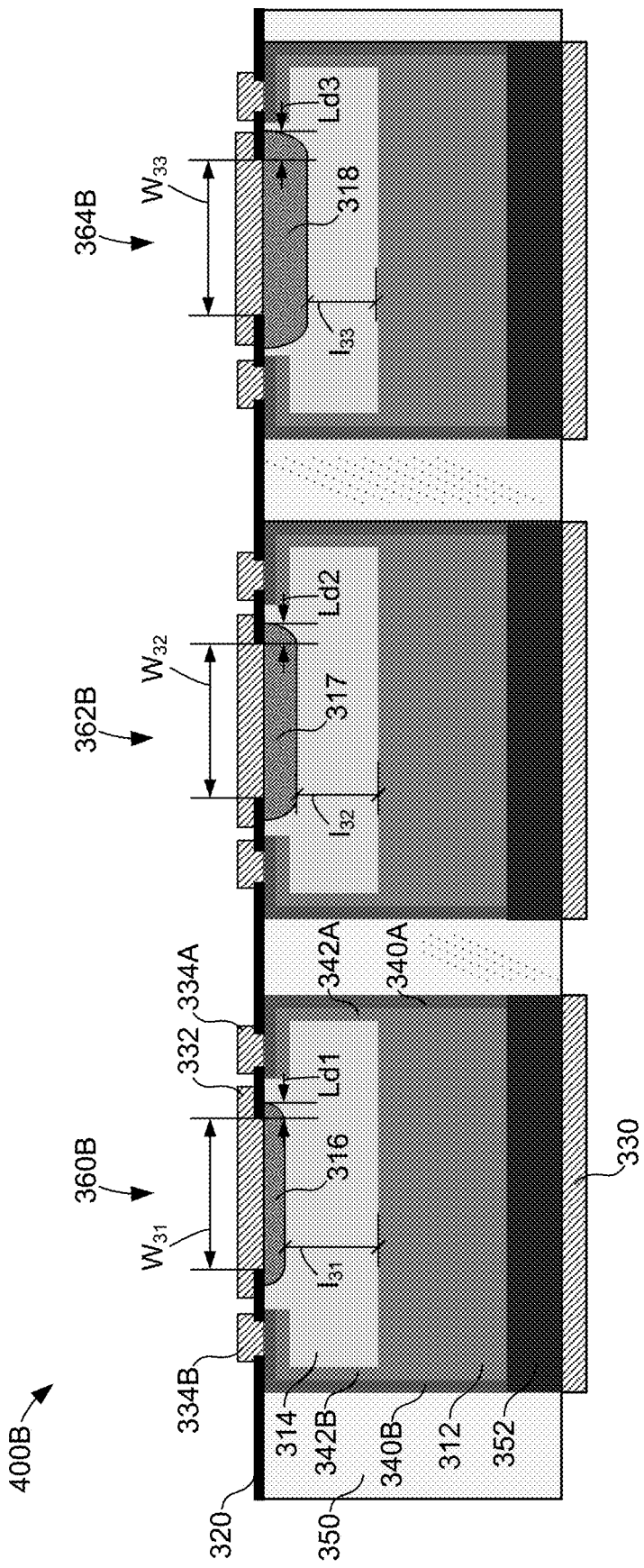
FIG. 5B illustrates another example HMIC silicon PIN diode structure with multi-thickness intrinsic regions according to various embodiments described herein.

FIG. 5B illustrates another example HMIC silicon PIN diode structure 400B according to various embodiments described herein. The PIN diode structure 400B includes PIN diode devices 360B, 362B, and 364B. The PIN diode structure 400B is similar to the PIN diode structure 400 shown in FIG. 5A. However, as compared to the PIN diode device 360 shown in FIG. 5A, the PIN diode device 360B in FIG. 5B also includes the insulating material layer 352, which is similar to the insulating material layer 260 in FIG. 4. The PIN diode device 362B and 364B also include similar insulating material layers. Thus, the PIN diode structure 400B is formed for series connections among the PIN diode devices 360B, 362B, and 364B. The cathode contacts, such as the cathode contact 330, may be optionally included in the embodiment shown in FIG. 5B for the purpose of mechanical die attachment. In some cases, the cathode contacts can be omitted.

In other examples, a diode structure including a combination of the PIN diode devices 360, 362, and 364, as shown in FIG. 5A, and the PIN diode devices 360B, 362B, and 364B, as shown in FIG. 5B, can be formed together on the same substrate. In that case, a number of PIN diodes can be arranged in both series and shunt configurations along with various components in a monolithic circuit format suitable for microwave circuit applications.

Figure 6:
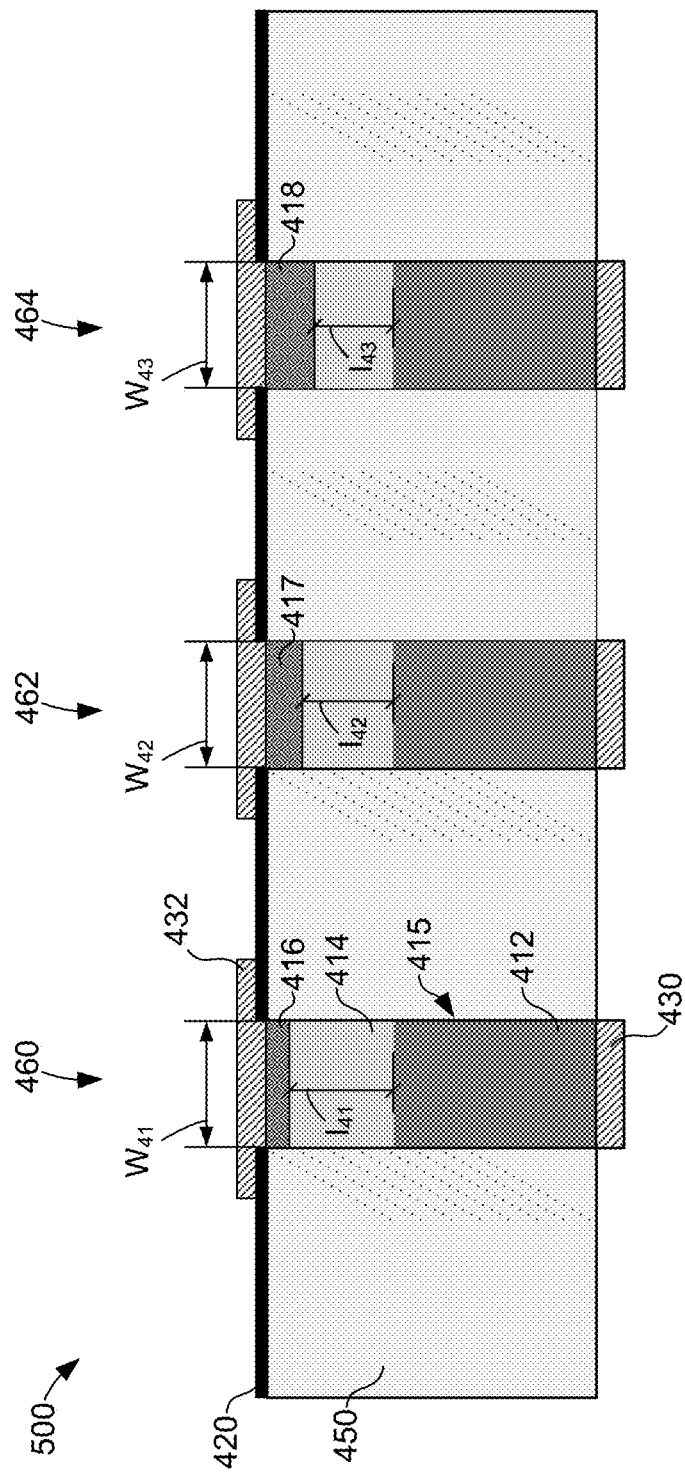
FIG. 6 illustrates another example HMIC silicon PIN diode structure with multi-thickness intrinsic regions according to various embodiments described herein.

FIG. 6 illustrates an example HMIC silicon PIN diode structure 500 according to various embodiments described herein. The PIN diode structure 500 is illustrated as a representative example in FIG. 6. The shapes and sizes of the layers of the PIN diode structure 500 are not necessarily drawn to scale. The layers shown in FIG. 6 are not exhaustive, and the PIN diode structure 500 can include other layers and elements not separately illustrated. Additionally, the PIN diode structure 500 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 6, by interchanging the P-type and N-type dopants.

The PIN diode structure 500 includes PIN diode devices 460, 462, and 464. The PIN diode device 460 includes an N-type semiconductor substrate 412, an intrinsic layer 414, and a P-type region 416 formed in the intrinsic layer 414. The N-type semiconductor substrate 412 forms a cathode and the P-type region 416 forms an anode of the PIN diode device 460. The P-type region 416 is formed through the opening of width $W_{41}$ in the insulating layer 420. The PIN diode device 460 includes a topside anode contact 432 formed over the P-type region 416. The PIN diode device 460 also includes a backside cathode contact 430.

The PIN diode devices 462 and 464 are similar in form and size as compared to the PIN diode device 460. However, the P-type region 417 is diffused deeper than the P-type region 416, and the P-type region 418 is diffused deeper than the P-type region 417. To obtain that form, a method of manufacturing the PIN diode structure 500 can follow the process steps illustrated in FIG. 2B and described above. Particularly, the P-type regions 416-418 can be formed sequentially, or in turn, in the intrinsic layer 414 according to the process steps shown in FIG. 2B. In that way, the P-type anode region 416 is diffused to the least extent into the intrinsic layer 414, the P-type region 417 diffused to a greater extent into the intrinsic layer 414, and the P-type region 418 is diffused the greatest extent into the intrinsic layer 414. Thus, the effective intrinsic region $I_{41}$ under the P-type region 416 is larger than the effective intrinsic region $I_{42}$ under the P-type region 417, and the effective intrinsic region $I_{42}$ is larger than the effective intrinsic region $I_{43}$ under the P-type region 418. In one example, the effective intrinsic region $I_{41}$ can be between about 20-23 μm, the effective intrinsic region $I_{42}$ can be about 12 μm, and the effective intrinsic region $I_{43}$ can be about 5 μm, although other ranges are within the scope of the embodiments.

Sidewall insulators 415 can also be formed along the sidewalls of the intrinsic layer 414 and the substrate 412 of the PIN diode device 460. The sidewall insulators 415 can include a passivating dielectric or oxide layer. To form the sidewall insulators 415, the sidewalls of the intrinsic layer 414 and the substrate 412 are exposed through vertical etching in a manner similar to that described above with reference to FIG. 3, but among all of the PIN diode devices 460, 462, and 464. The sidewall insulators 415 can then be formed on the sidewalls of the PIN diode device 460 and the corresponding sidewalls of the PIN diode devices 462 and 464, to ensure there are no vertical leakage paths between the anodes and the cathodes in those devices.

The insulator 450 can then be fused among the PIN diode devices 460, 462, and 464 in a manner similar to that described above. The application of the insulator 450 can start with a blanket deposition of silicon nitride by LPCVD, for example, followed by a deposit of LTO. Those layers (although not shown in FIG. 6) can encapsulate and protect the PIN diode devices 460, 462, and 464 during the application of the insulator 450. The insulator 450 can then be fused into the etched areas around the PIN diode devices 460, 462, and 464, forming a conformal layer. The insulator 450 can be formed to a thickness of at least 50 μm higher than the depth of the vertical etch, to allow for a step of glass planarization. The insulator 450 can be a borosilicate glass, for example, which exhibits a low dielectric constant, a low loss tangent, and a thermal coefficient of expansion similar to silicon for ruggedness over a broad temperature range, although other types of insulators can be relied upon.

After the insulator 450 is fused, a number of backside processing steps can be performed. A backside of the substrate 412 can be ground down until the insulator 450 is exposed. The backside cathode contact 430 can then be formed to extend over the bottom side of the substrate 412. In some cases, rather than forming a separate backside cathode contact for each of the PIN diode devices 460, 462, and 464 as shown in FIG. 6, a single backside cathode contact can be formed to extend across the N-type semiconductor substrates of all the PIN diode devices 460, 462, and 464. The PIN diode structure 500 is designed to facilitate shunt connections among the PIN diode devices 460, 462, and 464.

Because no topside cathode returns are needed for shunt configurations of PIN diodes, the approach shown in FIG. 6 can be relied upon to control the capacitance of the individual PIN diode devices 460, 462, and 464. In FIG. 6, the etching process is used to determine the physical dimensions of the P-type regions 416, 417, and 418, independent of the junction depths of the anodes and the sizes of the windows $W_{41}$-$W_{43}$ in the insulating layer 420. Thus, the concerns regarding the extent of the lateral diffusions, Ld1, Ld2, and Ld3 in the other embodiments can be controlled according to the approach shown in FIG. 6. In other words, the etching process is used to determine the physical dimensions of the P-type regions 416, 417, and 418, to control the capacitance and the high-frequency characteristics of each individual PIN diode.

The diode structures and methods described above can be used to fabricate a wide variety of useful integrated circuits. For example, the diodes described above can be integrated with various components in a monolithic circuit format suitable for microwave circuit applications. The diodes can be integrated with capacitors, resistors, and inductors formed on the monolithic semiconductor structure. The monolithic format can provide a number of advantages over conventional techniques where discrete diodes are used, such as smaller size, reduced cost, and better and more controllable frequency response. According to aspects of the embodiments described below, when the diodes of different intrinsic regions are used in the design of a monolithic multistage limiter, the limiter exhibits improved reliability, ruggedness, RF performance, size, and cost as compared to the current discrete multistage limiter solutions.

Figure 7:
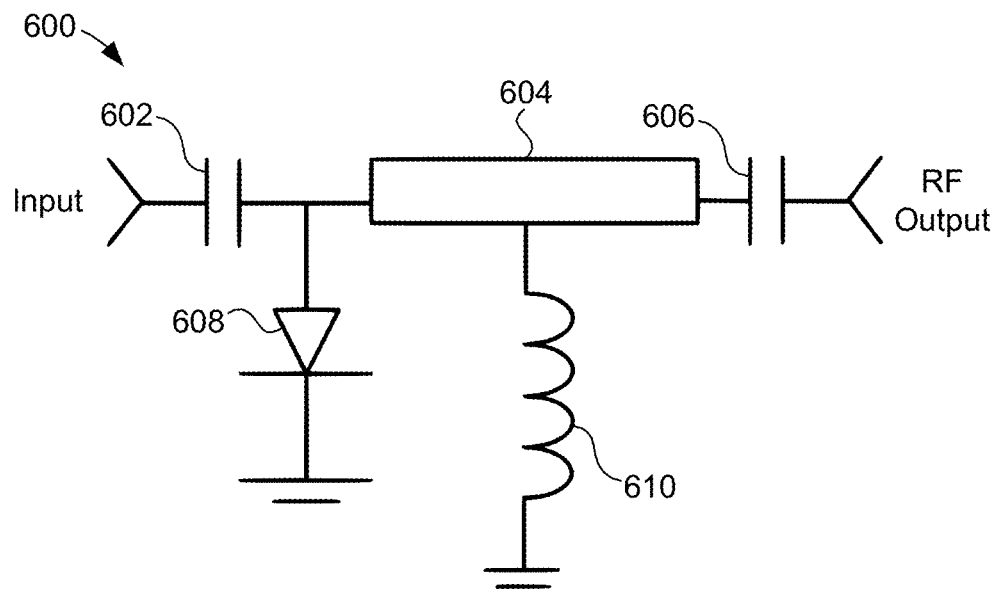
FIG. 7 illustrates an example limiter including one or more of the PIN diode structures shown in FIGS. 2A, 3, 4, 5A, 5B, and 6 according various embodiments described herein.

FIG. 7 illustrates an example limiter 600 using one or more of the PIN diode structures shown in FIGS. 2A, 3, 4, 5A, 5B, and 6 according various embodiments described herein. The limiter 600 is an example single-stage limiter. Limiters with additional stages are described in further detail below with reference to FIGS. 8 and 9. The limiter 600 includes an RF input and an RF output. The limiter 600 also includes a first DC blocking capacitor 602, a quarter-wavelength (i.e., λ/4) transmission line 604, and a second DC blocking capacitor 606 electrically connected in series, respectively, between the RF input and the RF output. The limiter 600 also includes a PIN diode 608. An anode of the PIN diode 608 is electrically connected between the first DC blocking capacitor 602 and the transmission line 604. A cathode of the PIN diode 608 is electrically connected to ground. The limiter 600 also includes an RF choke 610 or inductor electrically coupled between a point on the transmission line 604 and ground.

The PIN diode 608 can be embodied as any of the PIN diodes described above in the diode structure 100 of FIG. 2A, the diode structure 200 of FIG. 3, the diode structure 300 of FIG. 4, the diode structure 400 of FIG. 5A, the diode structure 400B of FIG. 5B, or the diode structure 500 of FIG. 6. The first DC blocking capacitor 602, quarter-wavelength transmission line 604, second DC blocking capacitor 606, and RF choke 610 can be formed over the PIN diode 608 using a number of suitable semiconductor manufacturing or fabrication process steps. Thus, a process of fabricating the limiter 600 can include one or more of the steps described above with reference to FIG. 2B to form the PIN diode 608, along with additional process steps to form the remaining circuit elements over the PIN diode 608.

The PIN diode 608 is arranged in a shunt configuration between the RF input to ground, with the RF choke 610 providing a DC return. In this shunt configuration topology, low level limiting, flat band leakage, and power handling and limiting are largely determined by the device characteristics of the PIN diode 608 of the limiter 600.

An RF signal received at the RF input of the limiter 600 couples through the first DC blocking capacitor 602 and passes through the PIN diode 608, which is in shunt to ground. As the RF signal passes through the PIN diode 608, a portion of the RF energy is rectified and provides a DC bias to turn the PIN diode 608 on and initiate the limiting function. In the single-stage limiter 600 shown in FIG. 7, low level turn on is controlled by the thickness of the intrinsic region of the PIN diode 608. For low flat leakage and rapid initiation of the limiting function, a thin intrinsic region is desired. On the other hand, to be able to handle high incident power levels, provide good isolation, and a low capacitance, a thick intrinsic region thickness is preferred or required. The need to balance these competing interests generally leads to a compromise solution for the limiter 600.

Figure 8:
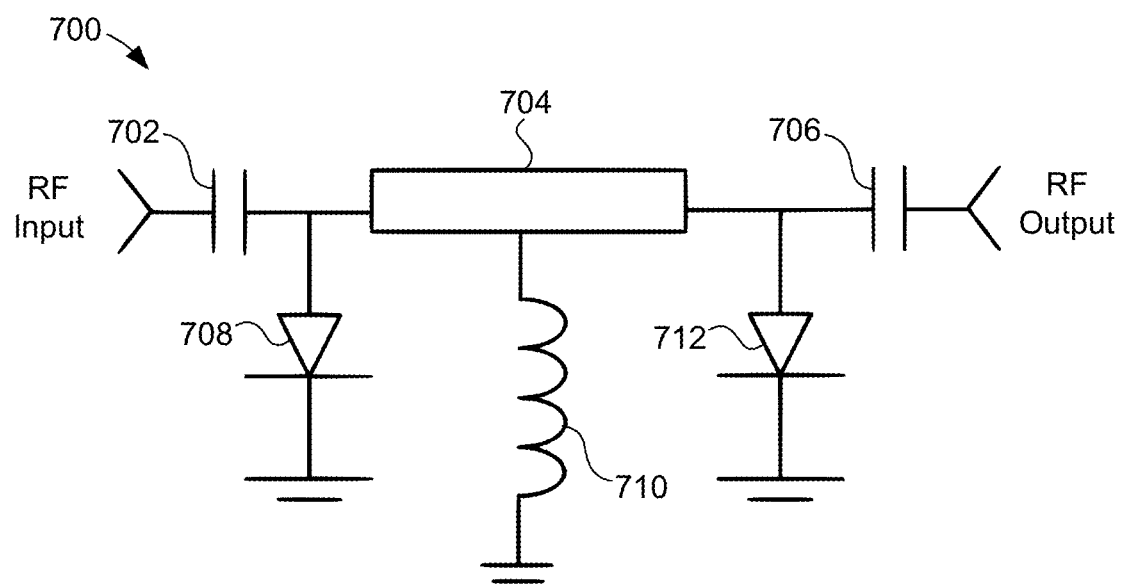
FIG. 8 illustrates an example multistage limiter including a hybrid combination of the PIN diodes shown in FIGS. 2A, 5A, 5B, and 6 according various embodiments described herein.

FIG. 8 illustrates an example multistage limiter 700 including a hybrid combination of the PIN diodes shown in FIGS. 2A, 5A, 5B, and 6 according various embodiments described herein. The limiter 700 can be embodied as a monolithic diode limiter semiconductor structure in which all elements are formed over the same substrate. The limiter 700 includes an RF input and an RF output. The limiter 700 also includes a first DC blocking capacitor 702, a quarter-wavelength transmission line 704, and a second DC blocking capacitor 706 electrically connected in series, respectively, between the RF input and the RF output. The limiter 700 also includes a first PIN diode 708, an RF choke 710 inductor, and a second PIN diode 712. An anode of the first PIN diode 708 is electrically connected between the first DC blocking capacitor 702 and the transmission line 704. A cathode of the first PIN diode 708 is electrically connected to ground of the monolithic diode limiter semiconductor structure. The RF choke 710 is electrically coupled between a point on the transmission line 704 and ground. An anode of the second PIN diode 712 is electrically connected between the transmission line 704 and the second DC blocking capacitor 706. A cathode of the second PIN diode 712 is also electrically connected to the ground of the monolithic diode limiter semiconductor structure.

The first PIN diode 708 and the second PIN diode 712 can be embodied using a hybrid combination of two of the PIN diodes in the diode structure 100 of FIG. 2A, the diode structure 400 of FIG. 5A, the diode structure 400B of FIG. 5B, or the diode structure 500 of FIG. 6, having different "I" region thicknesses. The first PIN diode 708 is arranged in a shunt configuration between the RF input to ground. The second PIN diode 708 is arranged in a shunt configuration between the RF output to ground. In this shunt configuration topology, low level limiting, flat band leakage, and power handling and limiting are largely determined by the device characteristics of the first PIN diode 708 and the second PIN diode 712 of the limiter 700.

The first PIN diode 708 and the second PIN diode 712 can be formed using the steps described above with reference to FIG. 2B. The first DC blocking capacitor 702, quarter-wavelength transmission line 704, second DC blocking capacitor 706, and RF choke 710 can be formed over the first PIN diode 708 and the second PIN diode 712 using a number of suitable semiconductor manufacturing or fabrication process steps. Thus, a process of fabricating the limiter 700 can include one or more of the steps described above with reference to FIG. 2B to form the first PIN diode 708 and the second PIN diode 712, along with additional process steps to form the remaining circuit elements over the first PIN diode 708 and the second PIN diode 712.

In the multistage limiter 700, the first PIN diode 708 acts as a "coarse" limiter, and the second PIN diode 712 acts as a "clean-up" limiter. In this topology, first PIN diode 708 can have a relatively thicker "I" region to handle high incident power levels, provide good isolation, and a low capacitance. Additionally, the second PIN diode 712 can have a relatively thinner "I" region for low flat leakage and rapid initiation of the limiting function. In this case, the competing interests of low level turn on, low flat leakage, and the rapid initiation of the limiting function can be balanced against the ability to handle high incident power levels, provide good isolation, and low capacitance. Further, the multistage limiter 700 can be realized monolithically, in a single package.

Figure 9:
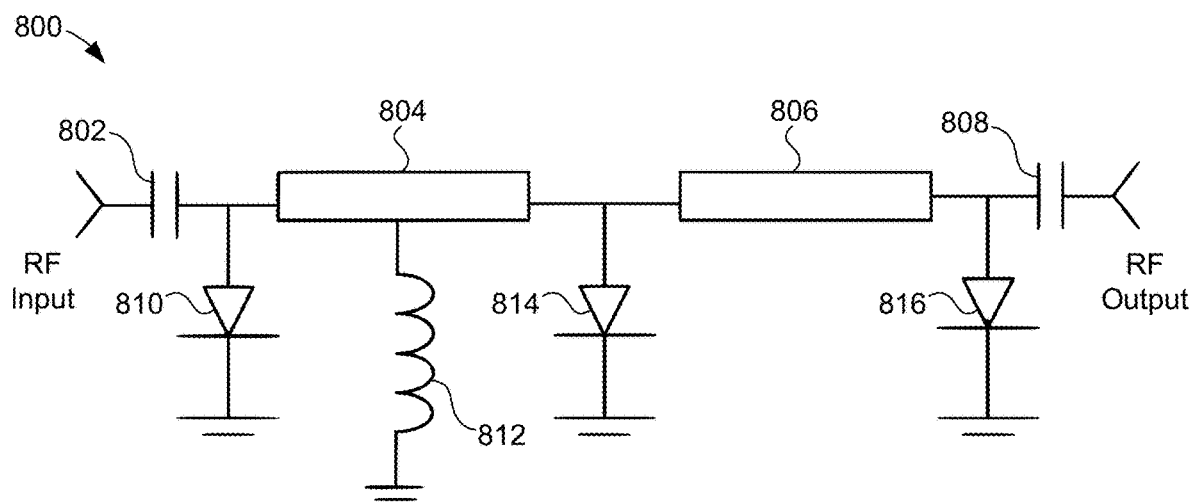
FIG. 9 illustrates another example multistage limiter including a hybrid combination of the PIN diodes shown in FIGS. 2A, 5A, 5B, and 6 according various embodiments described herein.

FIG. 9 illustrates another example multistage limiter 800 including a hybrid combination of the PIN diodes shown in FIGS. 2A, 5A, 5B, and 6 according to various embodiments described herein. The limiter 800 can be embodied as a monolithic diode limiter semiconductor structure in which all elements are formed over the same substrate. The limiter 800 includes an RF input and an RF output. The limiter 800 also includes a first DC blocking capacitor 802, a first quarter-wavelength transmission line 804, a second quarter-wavelength transmission line 806, and a second DC blocking capacitor 808 electrically connected in series, respectively, between the RF input and the RF output. The limiter 800 also includes a first PIN diode 810, an RF choke 812, a second PIN diode 814, and a third PIN diode 816. An anode of the first PIN diode 810 is electrically connected between the first DC blocking capacitor 802 and the first transmission line 804. A cathode of the first PIN diode 810 is electrically connected to ground of the monolithic diode limiter semiconductor structure. The RF choke 812 is electrically coupled between a point on the transmission line 804 and ground. An anode of the second PIN diode 814 is electrically connected between the first transmission line 704 and the second transmission line 806. A cathode of the second PIN diode 814 is also electrically connected to the ground of the monolithic diode limiter semiconductor structure. An anode of the third PIN diode 816 is electrically connected between the second transmission line 816 and the second DC blocking capacitor 808. A cathode of the third PIN diode 816 is electrically connected to ground.

The first PIN diode 810, the second PIN diode 814, and the third PIN diode 816 can be embodied using a hybrid combination of three of the PIN diodes in the diode structure 100 of FIG. 2A, the diode structure 400 of FIG. 5A, the diode structure 400B of FIG. 5B, or the diode structure 500 of FIG. 6, having different "I" region thicknesses. The first PIN diode 810, the second PIN diode 814, and the third PIN diode 816 are all arranged in a shunt configuration to ground. In this shunt configuration topology, low level limiting, flat band leakage, and power handling and limiting are largely determined by the device characteristics of the first PIN diode 810, the second PIN diode 814, and the third PIN diode 816.

The first PIN diode 810, the second PIN diode 814, and the third PIN diode 816 can be formed using the steps described above with reference to FIG. 2B. The first DC blocking capacitor 802, first transmission line 804, second transmission line 806, second DC blocking capacitor 806, and RF choke 812 can be formed over the diodes 810, 814, and 816 using a number of suitable semiconductor manufacturing or fabrication process steps. Thus, a process of fabricating the limiter 800 can include one or more of the steps described above with reference to FIG. 2B to form the diodes 810, 814, and 816, along with additional process steps to form the remaining circuit elements over the diodes 810, 814, and 816.

In the multistage limiter 800, the first PIN diode 810 can have a relatively thicker "I" region. The second PIN diode 814 can have a relatively thinner "I" region than the first PIN diode 810. Additionally, the third PIN diode 816 can have a thinner "I" region than the second PIN diode 814. In this case, the competing interests of low level turn on, low flat leakage, and the rapid initiation of the limiting function can also be balanced against the ability to handle high incident power levels, provide good isolation, and low capacitance. Further, the multistage limiter 800 can be realized monolithically, in a single package, using a combination of one or more PIN diodes with different "I" region thicknesses.

The example limiter and multistage limiters shown in FIGS. 7-8 are provided as examples, and other limiter and multistage limiter topologies are within the scope of the embodiments. The structures and methods described herein can be used to fabricate a wide variety of useful integrated circuits, such as switches, limiters, and other devices. Particularly, combinations of the PIN and NIP diodes described above, with various "I" region thicknesses, can be integrated with various components (e.g., blocking capacitors, transmission lines, RF chokes, resistors, etc.) in a monolithic circuit format suitable for switches, limiters, and other devices in microwave circuit applications.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A diode limiter, comprising:
   a first diode comprising a first doped region formed to a first depth into an intrinsic layer of a semiconductor structure such that the first diode comprises a first effective intrinsic region of a first thickness;
   a second diode comprising a second doped region formed to a second depth into the intrinsic layer of the semiconductor structure such that the second diode comprises a second effective intrinsic region of a second thickness, the first thickness being greater than the second thickness; and
   at least one passive component.

2. The diode limiter of claim 1, wherein the passive component is electrically coupled to at least one of the first diode or the second diode as part of the diode limiter.

3. The diode limiter of claim 1, wherein:
   a dopant in the first doped region and in the second doped region comprises a P-type dopant; and
   the first diode and the second diode comprise PIN diodes.

4. The diode limiter of claim 1, wherein:
   a dopant in the first doped region and in the second doped region comprises an N-type dopant; and
   the first diode and the second diode comprise NIP diodes.

5. The diode limiter of claim 1, further comprising:
   a dielectric layer over the intrinsic layer of the semiconductor structure, the dielectric layer comprising a plurality of openings, wherein:
   the first doped region is positioned under a first opening among the plurality of openings; and
   the second doped region is positioned under a second opening among the plurality of openings.

6. The diode limiter of claim 5, wherein a first width of the first opening is different than a second width of the second opening.

7. The diode limiter of claim 1, wherein:
   the first diode further comprises a first sidewall; and
   the second diode further comprises a second sidewall.

8. The diode limiter of claim 7, wherein the diode limiter further comprises an insulator between the first sidewall of the first diode and the second sidewall of the second diode.

9. The diode limiter of claim 1, wherein:
   the first diode further comprises a first doped sidewall; and
   the second diode further comprises a second doped sidewall.

10. The diode limiter of claim 9, wherein the diode limiter further comprises an insulator between the first doped sidewall of the first diode and the second doped sidewall of the second diode.

11. The diode limiter of claim 1, wherein:
the first diode further comprises a first metallic sidewall conductor; and
the second diode further comprises a second metallic sidewall conductor.

12. The diode limiter of claim 11, wherein the diode limiter further comprises an insulator between the first metallic sidewall of the first diode and the second metallic sidewall of the second diode.

13. The diode limiter of claim 1, further comprising:
a dielectric layer over the intrinsic layer of the semiconductor structure; and
a backside contact under the semiconductor structure.

14. The diode limiter of claim 1, wherein:
the first diode further comprises a first metallic sidewall conductor;
the second diode further comprises a second metallic sidewall conductor;
the diode limiter further comprises:
a first backside contact under the first diode;
a second backside contact under the second diode;
a first topside cathode contact for the first diode;
a first topside anode contact for the first diode;
a second topside cathode contact for the second diode; and
a second topside anode contact for the second diode.

15. The diode limiter of claim 1, wherein:
the first diode further comprises first doped sidewalls and first metallic sidewall conductors;
the second diode further comprises second doped sidewalls and second metallic sidewall conductors;
the diode limiter further comprises:
a first backside contact under the first diode; and
a second backside contact under the second diode;
the first metallic sidewall conductors are electrically coupled to the first backside contact; and
the second metallic sidewall conductors are electrically coupled to the second backside contact.

16. The diode limiter of claim 15, further comprising:
a first topside cathode contact for the first diode;
a first topside anode contact for the first diode;
a second topside cathode contact for the second diode; and
a second topside anode contact for the second diode.

17. The diode limiter of claim 1, further comprising a third diode, the third diode comprising a third doped region formed to a third depth into the intrinsic layer of the semiconductor structure such the third diode comprises a third effective intrinsic region of a third thickness, the second thickness being greater than the third thickness.

18. The diode limiter of claim 17, wherein:
the first diode further comprises sidewalls;
the second diode further comprises sidewalls;
the third diode further comprises sidewalls; and
the diode limiter further comprises an insulator between a sidewall of the first diode and a first sidewall of the second diode and between a second sidewall of the second diode and a sidewall of the third diode.

19. The diode limiter of claim 17, further comprising:
topside anode contacts for each of the first diode, the second diode, and the third diode; and
topside cathode contacts for each of the first diode, the second diode, and the third diode.

20. The diode limiter of claim 1, wherein the diode limiter comprises a multistage hybrid diode limiter of at least two stages.

* * * * *